(12) United States Patent
Park et al.

(10) Patent No.: US 10,903,816 B2
(45) Date of Patent: Jan. 26, 2021

(54) THIN-FILM TYPE PACKAGE

(71) Applicant: Samsung Electro-Mechanics Co., Ltd., Suwon-si (KR)

(72) Inventors: Seung Wook Park, Suwon-si (KR); Jae Chang Lee, Suwon-si (KR); Jae Hyun Jung, Suwon-si (KR); Seong Hun Na, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/430,696

(22) Filed: Jun. 4, 2019

(65) Prior Publication Data

US 2020/0144986 A1    May 7, 2020

(30) Foreign Application Priority Data

Nov. 2, 2018  (KR) .................. 10-2018-0133452

(51) Int. Cl.
| | |
|---|---|
| *H03H 9/10* | (2006.01) |
| *H03H 9/15* | (2006.01) |
| *H03H 9/17* | (2006.01) |
| *H03H 9/05* | (2006.01) |
| *H01L 27/20* | (2006.01) |
| *H03H 9/13* | (2006.01) |
| *H03H 9/00* | (2006.01) |
| *H01L 23/00* | (2006.01) |
| *B81B 7/00* | (2006.01) |
| *B81C 1/00* | (2006.01) |

(52) U.S. Cl.
CPC .......... *H03H 9/171* (2013.01); *B81B 7/0032* (2013.01); *B81C 1/00333* (2013.01); *H01L 24/48* (2013.01); *H01L 27/20* (2013.01); *H03H 9/0014* (2013.01); *H03H 9/059* (2013.01); *H03H 9/105* (2013.01); *H03H 9/1092* (2013.01); *H03H 9/132* (2013.01); *B81C 2203/0154* (2013.01); *H01L 2224/48247* (2013.01); *H01L 2924/1461* (2013.01)

(58) Field of Classification Search
CPC ....... H03H 9/10; H03H 9/15; H03H 2009/155
USPC .......................................... 333/186–191, 193
See application file for complete search history.

(56) References Cited

U.S. PATENT DOCUMENTS

| 7,042,056 B2 * | 5/2006 | Koshido .................. H03H 3/08 257/414 |
| 8,704,424 B2 | 4/2014 | Yamaji et al. |

(Continued)

FOREIGN PATENT DOCUMENTS

| JP | 5104432 B2 | 12/2012 |
| KR | 10-0585995 B1 | 6/2006 |

*Primary Examiner* — Dean O Takaoka
(74) *Attorney, Agent, or Firm* — NSIP Law

(57) ABSTRACT

A thin-film package includes: a substrate; a wiring layer disposed on the substrate; a microelectromechanical systems (MEMS) element disposed on a surface of the substrate; a partition wall disposed on the substrate to surround the MEMS element, and formed of a polymer material; a cap forming a cavity with the substrate and the partition wall; and an external connection electrode connected to the wiring layer. The external connection electrode includes at least one inclined portion disposed on at least one inclined surface formed on any one or any combination of any two or more of the substrate, the partition wall, and the cap.

19 Claims, 12 Drawing Sheets

(56) References Cited

U.S. PATENT DOCUMENTS

| | | | |
|---|---|---|---|
| 2004/0125970 A1* | 7/2004 | Kawakubo | H03H 3/02 381/190 |
| 2006/0131731 A1* | 6/2006 | Sato | B81B 7/007 257/704 |
| 2006/0192462 A1* | 8/2006 | Iwamoto | H03H 9/1092 310/348 |
| 2017/0077900 A1* | 3/2017 | Park | H01L 41/23 |
| 2018/0109237 A1 | 4/2018 | Wasilik et al. | |

* cited by examiner

THIN-FILM TYPE PACKAGE

CROSS-REFERENCE TO RELATED APPLICATIONS

This application claims benefit under 35 U.S.C. § 119(a) of Korean Patent Application No. 10-2018-0133452 filed on Nov. 2, 2018 in the Korean Intellectual Property Office, the entire disclosure of which is incorporated herein by reference for all purposes.

BACKGROUND

1. Field

The following description relates to a thin film type package.

2. Description of Related Art

A wafer level package (WLP) has been replaced with a thin-film package, which has recently been developed, and is recognized as a technology which can create a technical advantage in the filter device market. In addition, such a thin-film package is used to implement thinning and miniaturization of devices, and to enhance competitiveness in terms of manufacturing costs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a thin-film package includes: a substrate; a wiring layer disposed on the substrate; a microelectromechanical systems (MEMS) element disposed on a surface of the substrate; a partition wall disposed on the substrate to surround the MEMS element, and formed of a polymer material; a cap forming a cavity with the substrate and the partition wall; and an external connection electrode connected to the wiring layer. The external connection electrode includes at least one inclined portion disposed on at least one inclined surface formed on any one or any combination of any two or more of the substrate, the partition wall, and the cap.

The cap may include a first cap disposed to cover the cavity, and a second cap disposed to cover the first cap and formed of a polymer material.

The partition wall may include an inclined outer surface, and the second cap comprises an inclined surface corresponding to the inclined outer surface of the partition wall.

An inclined portion, among the at least one inclined portion, may be disposed on the inclined surface of the second cap.

A passivation layer may be formed between the partition wall and the second cap.

The partition wall may include an inclined outer surface, and the second cap may include an inclined surface disposed inside the inclined outer surface of the partition wall.

The at least one inclined portion may include a first inclined portion disposed on the inclined surface of the second cap, and a second inclined portion disposed on the inclined outer surface of the partition wall.

The external connection electrode may further include a first horizontal portion disposed on an upper surface of the second cap and connected to the first inclined portion, a second horizontal portion disposed on an upper surface of the partition wall and connected to the first and the second inclined portions, and a connection portion comprising a side connected to the second inclined portion, and another side connected to the wiring layer.

The external connection electrode may include a first horizontal portion disposed on an upper surface of the second cap, a via portion passing through the second cap, a second horizontal portion disposed on an upper portion of the partition wall, and a connection portion connected to the wiring layer and an inclined portion, among the at least one inclined portion. The inclined portion may be disposed on an inclined surface, among the at least one inclined surface, that is disposed on the partition wall.

The external connection electrode may include a horizontal portion disposed on an upper portion of the partition wall and connected to a solder ball that passes through the second cap, and a connection portion connected the wiring layer and an inclined portion, among the at least one inclined portion. The inclined portion may be disposed on an inclined surface, among the at least one inclined surface, that is disposed on the partition wall.

An inclined surface, among the at least one inclined surface, may be disposed on a side surface of the substrate. An inclined portion, among the at least one inclined portion, may be disposed on the inclined surface.

The thin-film package may further include an encapsulant formed to cover the substrate.

The second cap may be formed of a metal material. The second cap may be connected to the external connection electrode. The second cap may be configured as a ground electrode.

The thin-film package may further include a through electrode connecting the second cap to the wiring layer.

An inclined surface, among the at least one inclined surface, may be disposed on a side surface of the substrate. An inclined portion, among the at least one inclined portion, may be disposed on the inclined surface.

In another general aspect, a thin-film package includes: a substrate; a wiring layer disposed on the substrate; a partition wall disposed on the substrate; a first cap formed of a metal material, and forming a cavity with the substrate and the partition wall; a second cap formed to cover the first cap; and an external connection electrode connected to the wiring layer and the first cap.

The external connection electrode may include a first inclined portion disposed on an inclined side surface of the partition wall, and a first horizontally extending portion disposed on an upper surface of the first cap.

The thin-film package may further include a second inclined portion extending from the first horizontally extending portion, and disposed on an inclined side surface of the second cap.

The thin-film package may further include a second horizontally extending portion extending from the second inclined portion, and disposed on an upper surface of the second cap.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
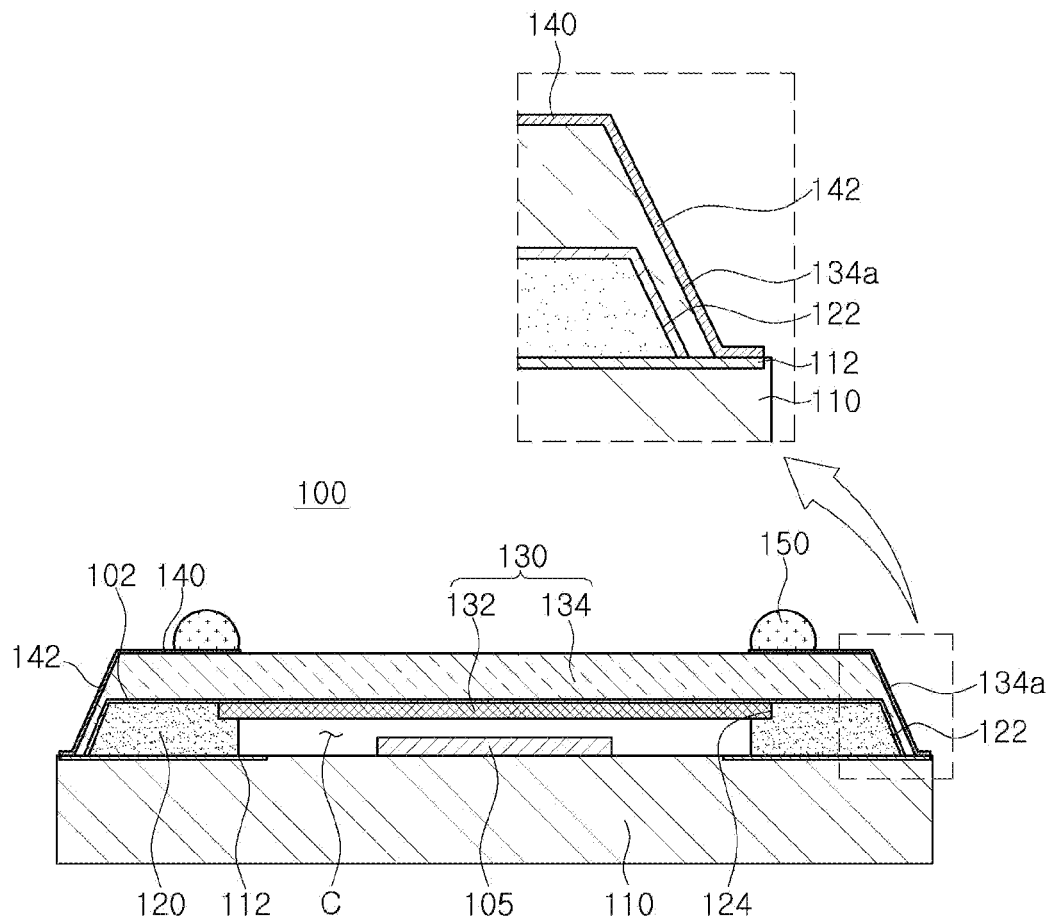
FIG. 1 is a schematic cross-sectional view illustrating a thin-film package, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic cross-sectional view illustrating a thin-film package 100, according to an embodiment.

Referring to FIG. 1, the thin-film package 100 may include a substrate 110, a partition wall 120, a cap 130, and an external connection electrode 140, by way of example.

The substrate 110 may be a silicon substrate. For example, a silicon wafer or a silicon-on-insulator (SOI) substrate may be used as the substrate 110. As an example, the substrate 110 is provided with a wiring layer 112, and the wiring layer 112 is connected to the external connection electrode 140.

A microelectromechanical systems (MEMS) element 105 may be disposed on the substrate 110. The MEMS element 105 is disposed inside the partition wall 120, and may be a bulk acoustic wave (BAW) resonator, a surface acoustic wave (SAW) resonator, an acceleration sensor, an angular velocity sensor, or the like, by way of example.

In addition, the wiring layer 112 may be connected to an electrode provided on the MEMS element 105.

The partition wall 120 is disposed on an edge region of the substrate 110, and forms a cavity C between the substrate 110 and the cap 130. In other words, the partition wall 120 enables a central portion of the substrate 110 to be spaced apart from a central portion of the cap 130 by a predetermined distance. The partition wall 120 may be formed of a polymer material. In addition, an inclined surface 122 is formed on a side surface of the partition wall 120. Moreover, an inclination angle of the inclined surface 122 may be an acute angle. In addition, a groove 124 on which an edge of a first cap 132 to be described later is mounted may be formed in the partition wall 120.

The cap 130 may form a cavity C with the substrate 110 and the partition wall 120. Moreover, the cap 130 may include a first cap 132 disposed to cover the cavity C, and a second cap 134 disposed to cover the first cap 132.

The first cap 132 may be formed of a metal material or a polymer material. In addition, the edge portion of the first cap 132 may be mounted on and installed in the groove 124 of the partition wall 120.

The second cap 134 may be formed of a polymer material. A passivation layer 102 may be formed between the second cap 134 and the partition wall 120. In addition, the passivation layer 102 may form hermetic seal. However, in another example, the passivation layer 102 may be omitted.

The second cap 134 is formed to cover the inclined surface 122 of the partition wall 120. Accordingly, an inclined surface 134a is formed in the second cap 130. As described above, the second cap 134 is formed to cover the partition wall 120, thereby improving reliability of the hermetic seal.

The external connection electrode 140 may be formed on a portion of an upper surface of the second cap 134 and the inclined surface 134a, and may be connected to the wiring layer 112 of the substrate 110. In other words, the external connection electrode 140 may include an inclined portion 142, and an inclination angle of the inclined portion 142 may be an acute angle.

As described above, the external connection electrode 140 includes the inclined portion 142, formed on the inclined surface 134a of the second cap 134, thereby reducing stress applied to the external connection electrode 140. Accordingly, the risk of breakage of the external connection electrode 140 or a defect occurring during a manufacturing process may be reduced.

In more detail, according to the related art, an external connection electrode is formed to have a staircase shape with a side wall vertically disposed thereon, and thus stress is applied to a portion of the external connection electrode disposed on a side wall of the partition wall 120, so there may be a problem in which the external connection electrode 140 is broken or a defect rate during a manufacturing process is high.

However, since the inclined portion 142 of the external connection electrode 140 is formed on the inclined surface 134a of the second cap 134, less stress may be applied thereto in comparison to a conventional external connection electrode, and a formation process of the external connection electrode 140 (as an example, a plating and deposition process) may be easily performed. As a result, the risk of breakage of the external connection electrode 140 or a defect occurring during a manufacturing process may be reduced in comparison to a conventional external connection electrode.

In addition, the external connection electrode 140 may be formed using a conductive material such as molybdenum (Mo) or an alloy thereof. However, the disclosure is not limited to such an example, and the external connection electrode 140 may be formed of a conductive material such as ruthenium (Ru), tungsten (W), iridiym (Ir), platinium (Pt), copper (Cu), titanium (Ti), tantalum (Ta), nickel (Ni), chromium (Cr), or the like, or alloys thereof.

As an example, the external connection electrode 140 may be formed of a thin film.

A solder ball 150 may be formed on the external connection electrode 140. The solder ball 150 may be disposed on an upper portion of the cap 130.

As described above, the external connection electrode 140 includes the inclined portion 142, thereby reducing stress applied to the external connection electrode 140. Accordingly, a risk of breakage of the external connection electrode 140 or of a defect occurring during a manufacturing process may be reduced.

Additionally, the second cap 134 is formed to cover a side surface of the partition wall 120, thereby improving reliability of the hermetic seal.

Figure 2:
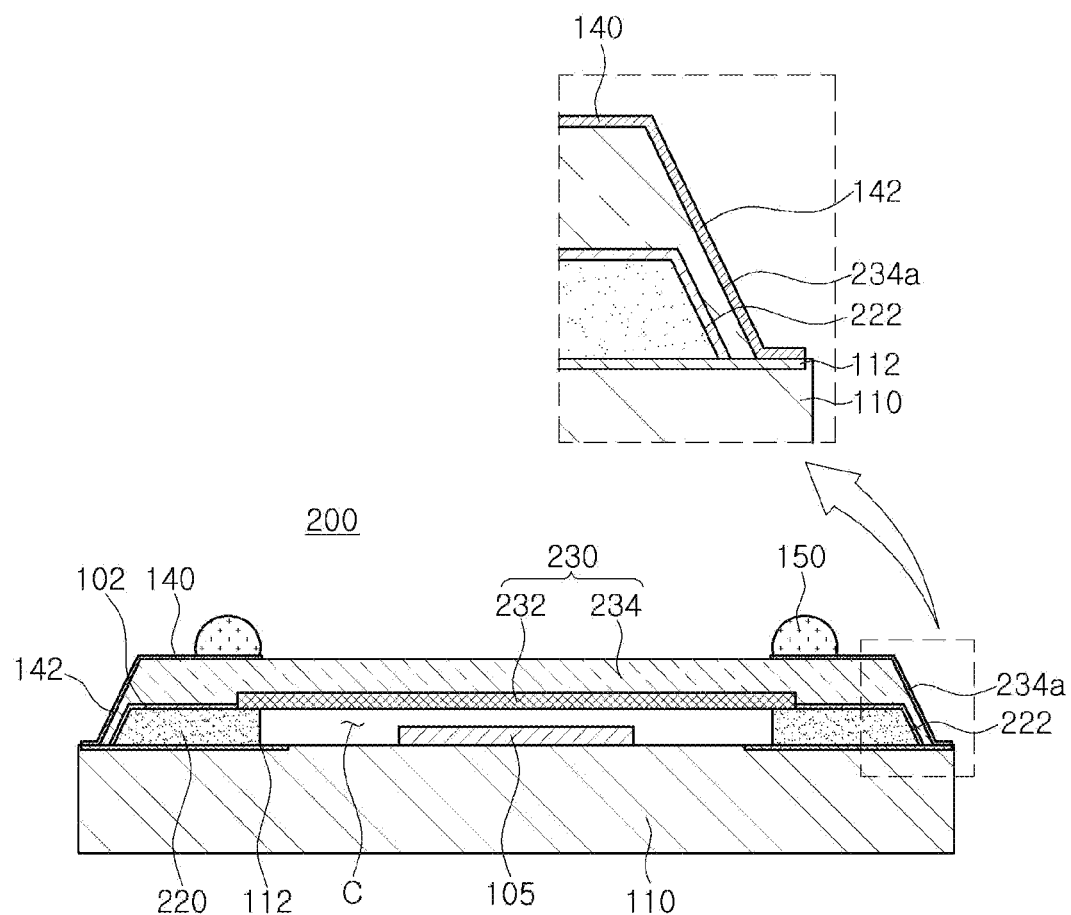
FIG. 2 is a schematic cross-sectional view illustrating a thin-film package, according to another embodiment.

FIG. 2 is a schematic cross-sectional view illustrating a thin-film package 200, according to another embodiment.

Referring to FIG. 2, the thin-film package 200 may include the substrate 110, a partition wall 220, a cap 230, and the external connection electrode 140, as an example.

The partition wall 220 is disposed on an edge region of the substrate 110, and forms a cavity C between the substrate 110 and the cap 230. In other words, the partition wall 220 enables a central portion of the substrate 110 to be spaced apart from a central portion of the cap 230 by a predetermined distance. The partition wall 220 may be formed of a polymer material. In addition, an inclined surface 222 is formed on a side surface of the partition wall 220. An inclination angle of the inclined surface 222 may be an acute angle.

The cap 230 may form the cavity C with the substrate 110 and the partition wall 220. Moreover, the cap 230 may include a first cap 232 disposed to cover the cavity C, and a second cap 234 disposed to cover the first cap 232. The first cap 232 may be formed of a metal material or a polymer material. In addition, the edge portion of the first cap 232 may be supported by an upper surface of the partition wall 220.

The second cap 234 may be formed of a polymer material. The passivation layer 102 may be formed between the second cap 234 and the partition wall 220. The passivation layer 102 may form hermetic seal. However, in another example, the passivation layer 102 may be omitted.

The second cap 234 is formed to cover the inclined surface 222 of the partition wall 220. Accordingly, an inclined surface 234a is also formed in the second cap 230. The second cap 234 is formed to cover the partition wall 220, thereby improving reliability of the hermetic seal.

Figure 3:
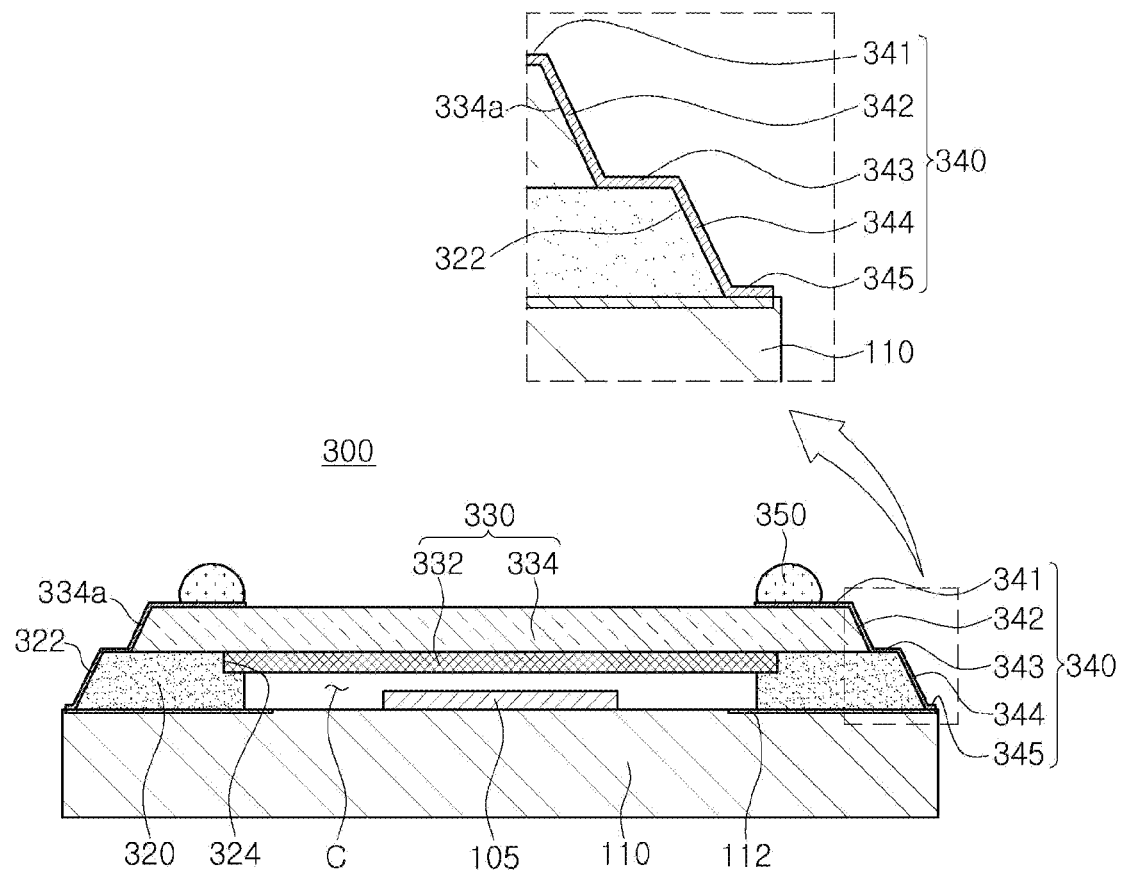
FIG. 3 is a schematic cross-sectional view illustrating a thin-film package, according to another embodiment.

FIG. 3 is a schematic cross-sectional view illustrating a thin-film package 300, according to another embodiment.

Referring to FIG. 3, the thin-film package 300 may include the substrate 110, a partition wall 320, a cap 330, and an external connection electrode 340, as an example.

The partition wall 320 is disposed on an edge region of the substrate 110, and forms a cavity C between the substrate 110 and the cap 330. In other words, the partition wall 320 enables a central portion of the substrate 110 to be spaced apart from a central portion of the cap 330 by a predetermined distance. The partition wall 320 may be formed of a polymer material. In addition, an inclined surface 322 is formed on a side surface of the partition wall 320. An inclination angle of the inclined surface 322 may be an acute angle. In addition, a groove 324 on which an edge portion of a first cap 332 to be described later is mounted may be formed in the partition wall 320.

The cap 330 may form the cavity C with the substrate 110 and the partition wall 320. The cap 330 may include a first cap 332 disposed to cover the cavity C, and a second cap 334 disposed to cover the first cap 332 and disposed on an upper portion of the partition wall 320. The first cap 332 may be formed of a metal material or a polymer material. In addition, the edge portion of the first cap 332 may be mounted on the groove 324 of the partition wall 320. Moreover, the second cap 334 may be formed of a polymer material.

In addition, the edge portion of the second cap 334 may be disposed on an upper surface of the partition wall 320. An inclined surface 334a is also formed in the second cap 334. An inclination angle of the inclined surface 334a may also be an acute angle.

The external connection electrode 340 is connected to the wiring layer 112 of the substrate 110, and is formed to cover portions of the partition wall 320 and the cap 330. As an example, the external connection electrode 340 may include a first horizontal portion 341 formed on an upper surface of the second cap 334, a first inclined portion 342 formed on the inclined surface 334a of the second cap 334, a second horizontal portion 343 formed on an upper surface of the partition wall 320, a second inclined portion 344 formed on the inclined surface 322 of the partition wall 320, and a connection portion 345 connected to the wiring layer 112 of the substrate 110. In addition, inclination angles of the first and second inclined portions 342 and 344 may also be acute angles.

Accordingly, stress applied to the external connection electrode 340 may be reduced. Thus, the risk of breakage of the external connection electrode 340 or a defect occurring during a manufacturing process may be reduced.

In addition, the external connection electrode 340 may be formed using a conductive material such as molybdenum (Mo) or an alloy thereof. However, the disclosure is not limited to such an example, and the external connection electrode 340 may be formed of a conductive material such as ruthenium (Ru), tungsten (W), iridiym (Ir), platinium (Pt), copper (Cu), titanium (Ti), tantalum (Ta), nickel (Ni), chromium (Cr), or the like, or alloys thereof.

As an example, the external connection electrode 340 may be formed of a thin film.

A solder ball 350 may be formed in the external connection electrode 340. The solder ball 350 may be formed on the first horizontal portion 341.

As described above, the first and second inclined portions 342 and 344 of the external connection electrode 340 are formed on the inclined surface 332 of the partition wall 320 and the inclined surface 332 of the cap 330, thereby reducing stress applied to the external connection electrode 340. Accordingly, the risk of breakage of the external connection electrode 340 or a defect occurring during a manufacturing process may be reduced.

Figure 4:
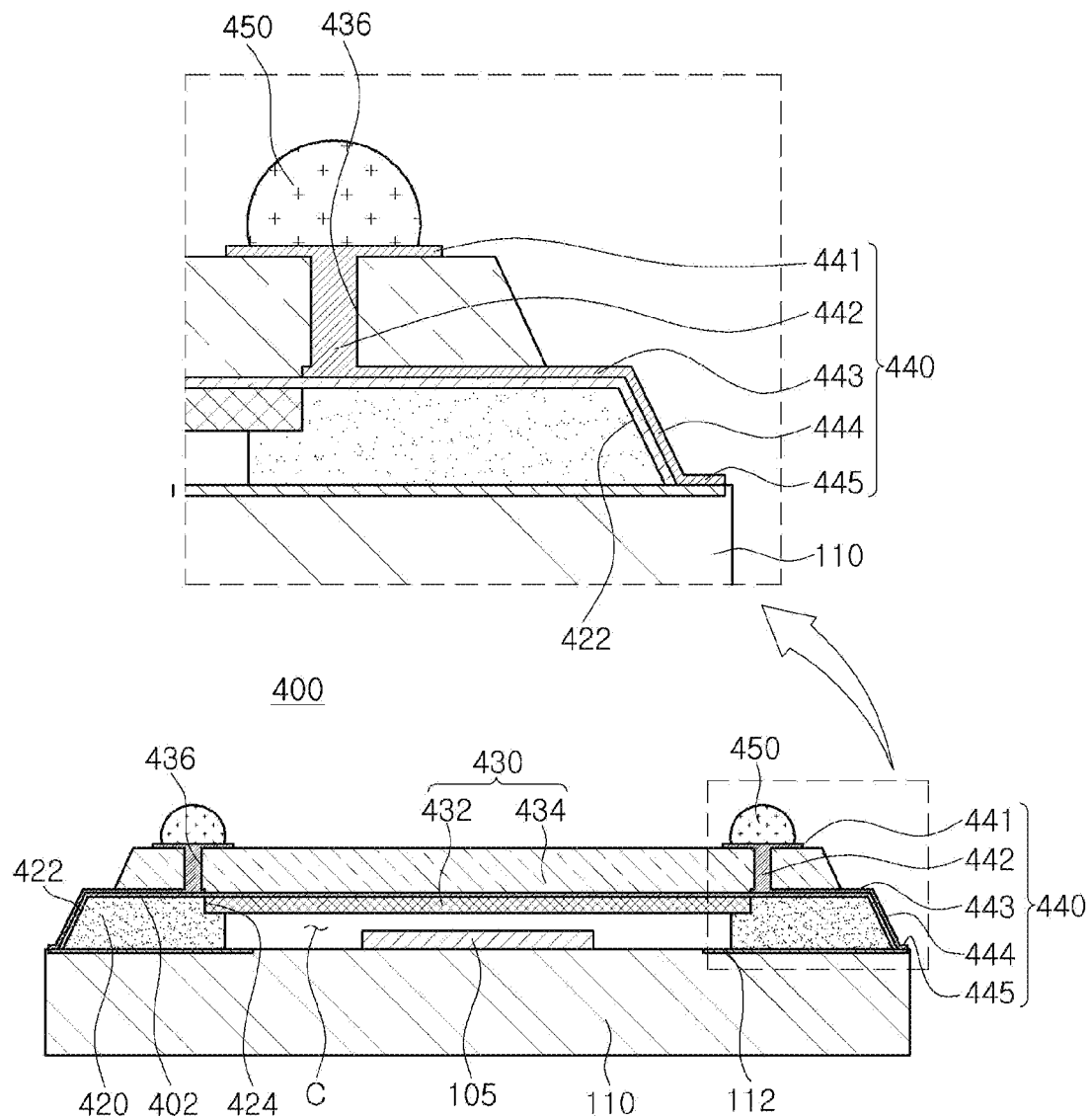
FIG. 4 is a schematic cross-sectional view illustrating a thin-film package according to another embodiment.

FIG. 4 is a schematic cross-sectional view illustrating a thin-film package 400, according to another embodiment.

Referring to FIG. 4, the thin-film package 400 may include the substrate 110, a partition wall 420, a cap 430, and an external connection electrode 440, as an example.

The partition wall 420 is disposed on an edge region of the substrate 110, and forms a cavity C between the substrate 110 and the cap 430. In other words, the partition wall 420 enables a central portion of the substrate 110 to be spaced apart from a central portion of the cap 430 by a predetermined distance. The partition wall 420 may be formed of a polymer material. In addition, an inclined surface 422 is formed on a side surface of the partition wall 420. An inclination angle of the inclined surface 422 may be an acute angle. In addition, a groove 424 on which an edge portion of a first cap 432 to be described later is mounted may be formed in the partition wall 420.

A passivation layer 402 may be formed on an upper surface of the partition wall 420 and the inclined surface 422.

The cap 430 may form the cavity C with the substrate 110 and the partition wall 420.

The cap 430 may include a first cap 432 disposed to cover the cavity C, and a second cap 434 disposed to cover the first cap 432. The first cap 432 may be formed of a metal material or a polymer material. In addition, the edge portion of the first cap 432 may be mounted on and installed in the groove 424 of the partition wall 420. Additionally, the second cap 434 may be formed of a polymer material.

The external connection electrode 440 may be connected to the wiring layer 112 of the substrate 110. In other words, a portion of the external connection electrode 440 is formed to cover the partition wall 420, and another portion of the external connection electrode 440 is formed to pass through the cap 430. As an example, the external connection electrode 440 may include a first horizontal portion 441 formed in an upper surface of the second cap 434, a via portion 442 formed in a through hole 436 of the second cap 434, a second horizontal portion 443 disposed on an upper portion of the partition wall 420, an inclined portion 444 formed on the inclined surface 422 of the partition wall 420, and a connection portion 445 connected to the wiring layer 112 of the substrate 110. In addition, an inclination angle of the inclined portion 444 may be an acute angle.

Accordingly, stress applied to the external connection electrode 440 may be reduced. Thus, the risk of breakage of the external connection electrode 440 or a defect occurring during a manufacturing process may be reduced.

In addition, the external connection electrode 440 may be formed using a conductive material such as molybdenum (Mo) or an alloy thereof. However, the disclosure is not limited to such an example, and the external connection electrode 440 may be formed of a conductive material such as ruthenium (Ru), tungsten (W), iridiym (Ir), platinium (Pt), copper (Cu), titanium (Ti), tantalum (Ta), nickel (Ni), chromium (Cr), or the like, or alloys thereof.

As an example, the external connection electrode 440 may be formed of a thin film.

A solder ball 450 may be formed in the external connection electrode 440. In other words, the solder ball 450 may be formed in the first horizontal portion 441.

As described above, the inclined portion 444 of the external connection electrode 440 is formed on the inclined surface 432 of the partition wall 420, thereby reducing stress applied to the external connection electrode 440. Accordingly, the risk of breakage of the external connection electrode 440 or a defect occurring during a manufacturing process may be reduced.

Figure 5:
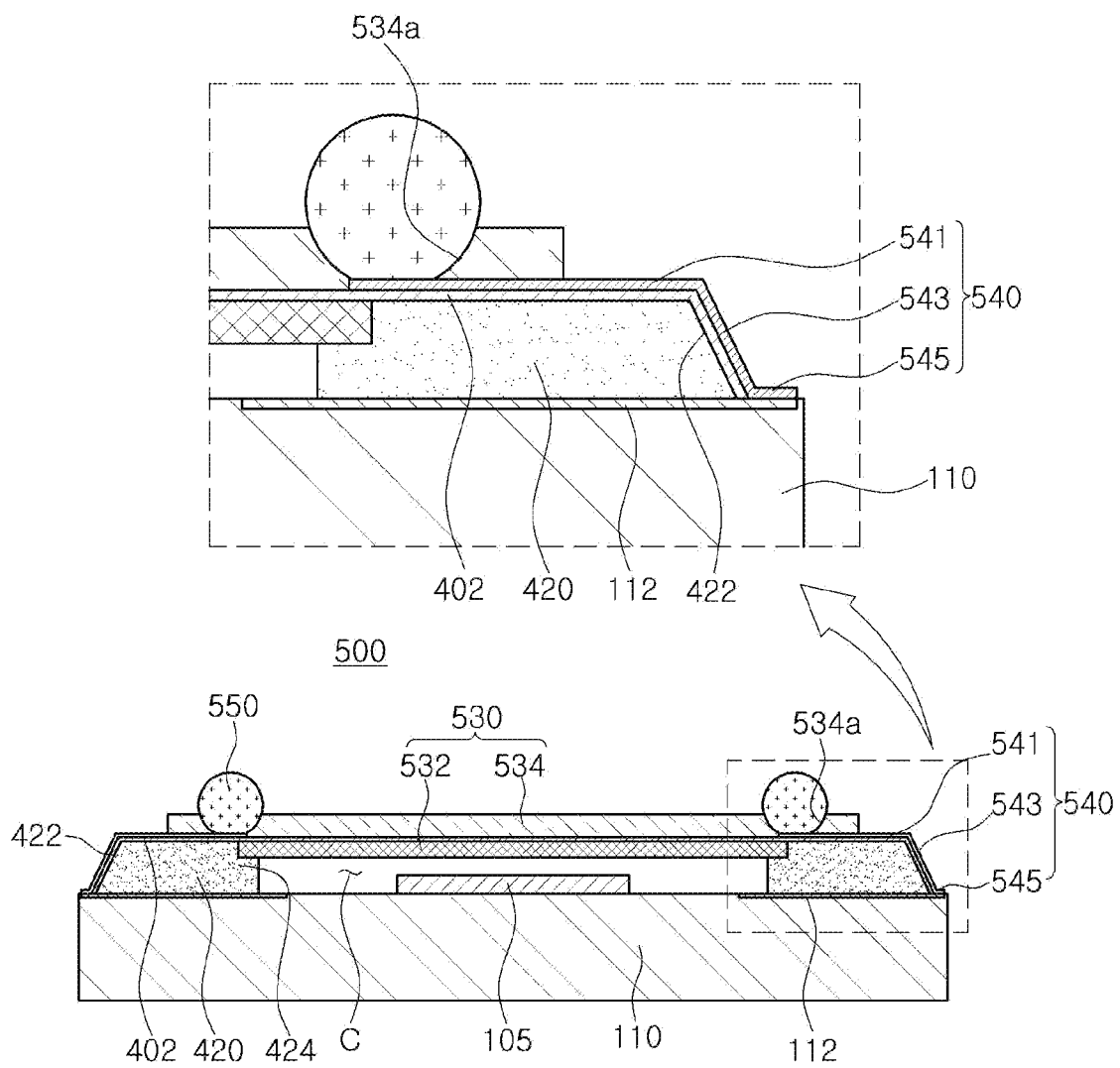
FIG. 5 is a schematic cross-sectional view illustrating a thin-film package, according to another embodiment.

FIG. 5 is a schematic cross-sectional view illustrating a thin-film package 500, according to another embodiment.

Referring to FIG. 5, the thin-film package 500 may include a substrate 110, the partition wall 420, a cap 530, and an external connection electrode 540, as an example.

The cap 530 may form a cavity C with the substrate 110 and the partition wall 420. The cap 530 may include a first cap 532 disposed to cover the cavity C, and a second cap 534 disposed to cover the first cap 532. The first cap 532 may be formed of a metal material or a polymer material. In addition, an edge portion of the first cap 532 may be mounted on and installed in the groove 424 of the partition wall 420.

The second cap 534 may be formed of a polymer material. In addition, a hole 534a for a solder ball, into which a solder ball 550 to be described later is inserted, is formed in the second cap 534.

A passivation layer 402 may be formed on an upper surface of the partition wall 420 and the inclined surface 422. However, the passivation layer 402 may be omitted.

The external connection electrode 540 is connected to the wiring layer 112 of the substrate 110, and is formed to cover a portion of the partition wall 420. As an example, the external connection electrode 540 may include a horizontal portion 541 disposed on an upper portion of the partition wall 420, an inclined portion 542 disposed on the inclined surface 422 of the partition wall 420, and a connection portion 543 connected to the wiring layer 112 of the substrate 110. In addition, an inclination angle of the inclined portion 542 may also be an acute angle.

Accordingly, stress applied to the external connection electrode 540 may be reduced. Thus, the risk of breakage of the external connection electrode 540 or a defect occurring during a manufacturing process may be reduced.

In addition, the external connection electrode 540 may be formed using a conductive material such as molybdenum (Mo) or an alloy thereof. However, the disclosure is not limited to such an example, and the external connection electrode 540 may be formed of a conductive material such as ruthenium (Ru), tungsten (W), iridiym (Ir), platinium (Pt), copper (Cu), titanium (Ti), tantalum (Ta), nickel (Ni), chromium (Cr), or the like, or alloys thereof.

As an example, the external connection electrode 540 may be formed of a thin film.

The solder ball 550 may be formed in the external connection electrode 540. The solder ball 550 may be connected to the horizontal portion 541.

Figure 6:
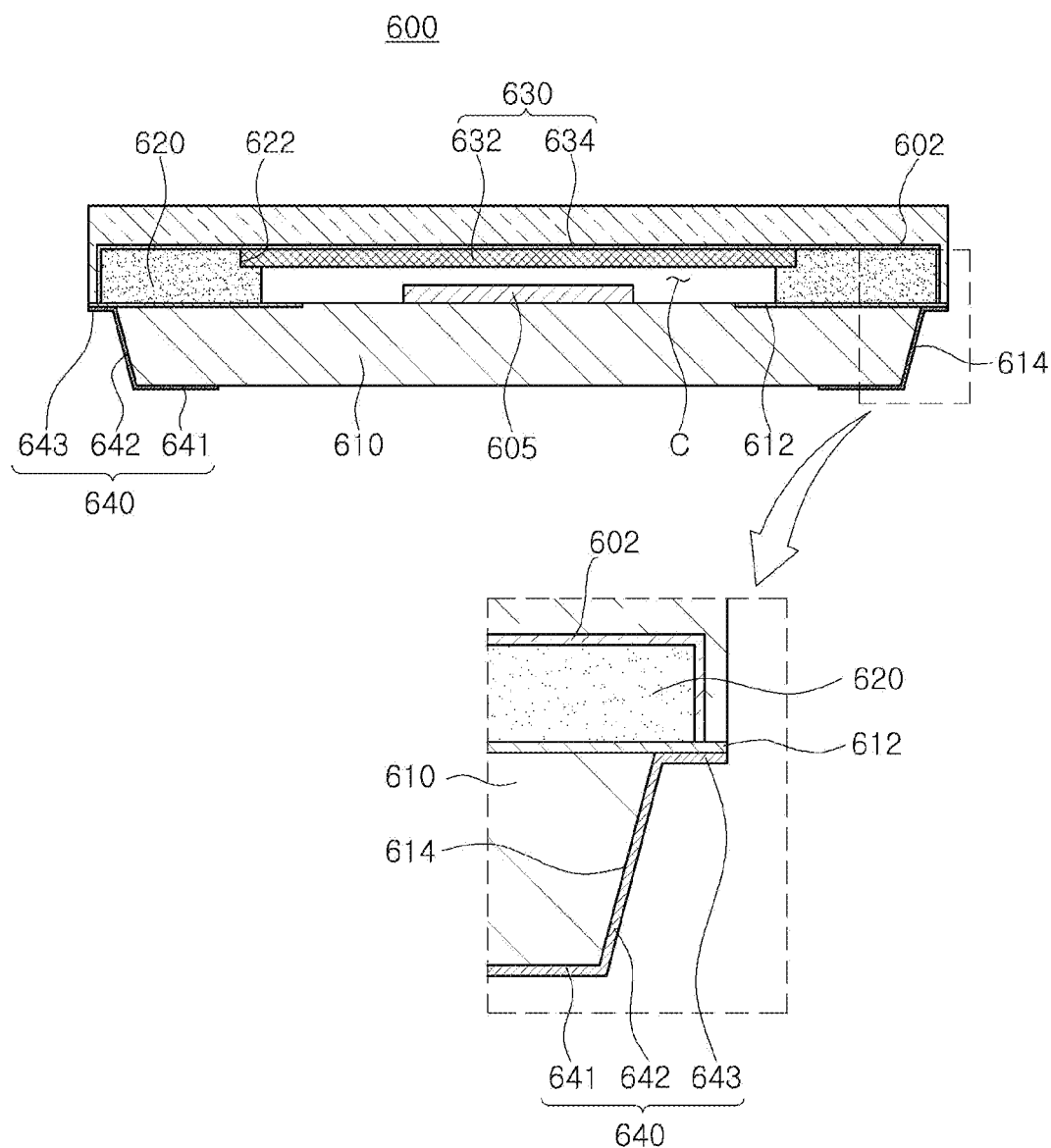
FIG. 6 is a schematic cross-sectional view illustrating a thin-film package, according to another embodiment.

FIG. 6 is a schematic cross-sectional view illustrating a thin-film package 600, according to another embodiment.

Referring to FIG. 6, the thin-film package 600 may include a substrate 610, a partition wall 620, a cap 630, and an external connection electrode 640, as an example.

The substrate 610 may be a silicon substrate. For example, a silicon wafer or a silicon-on-insulator (SOI) substrate may be used as the substrate 610. As an example, a wiring layer 612 is disposed on the substrate 610, and the wiring layer 612 is connected to the external connection electrode 640.

A microelectromechanical systems (MEMS) element 605 may be disposed on the substrate 610. The MEMS element 605 is disposed inside the partition wall 620, and may be a bulk acoustic wave (BAW) resonator, a surface acoustic wave (SAW) resonator, an acceleration sensor, an angular velocity sensor, or the like, by way of example. In addition, the wiring layer 612 may be connected to an electrode provided on the MEMS element 605.

As an example, a portion of the wiring layer 612 may be disposed to protrude outwardly from the substrate 610.

An inclined surface 614 may be formed on a side surface of the substrate 610. An inclination angle of the inclined surface 614 may be an acute angle.

The partition wall 620 is disposed on an edge region of the substrate 610, and forms a cavity C between the substrate 610 and the cap 630. In other words, the partition wall 620 enables a central portion of the substrate 610 to be spaced apart from a central portion of the cap 630 by a predetermined distance. The partition wall 620 may be formed of a polymer material. In addition, a groove 622 on which a first cap 632 to be described later is mounted may be formed in the partition wall 620.

The cap 630 may form the cavity C with the substrate 610 and the partition wall 620. The cap 630 may include a first cap 632 disposed to cover the cavity C, and a second cap 634 disposed to cover the first cap 632. The first cap 632 may be formed of a metal material or a polymer material. In addition, an edge portion of the first cap 632 may be mounted on and installed in the groove 622 of the partition wall 620.

The second cap 634 may be formed of a polymer material. In addition, a passivation layer 602 may be formed between the second cap 634 and the partition wall 620. The passivation layer 602 may form hermetic seal. However, in another example, the passivation layer 602 may be omitted.

The second cap 634 is formed to cover a side surface of the partition wall 620. Accordingly, reliability of the hermetic seal may be improved.

The external connection electrode 640 may be connected to the wiring layer 612 of the substrate 610. As an example, the external connection electrode 640 may include a horizontal portion 641 formed on a lower surface of the substrate 610, an inclined portion 642 formed on an inclined surface 614 of the substrate 610, and a connection portion 643 connected to the wiring layer 612. Meanwhile, an inclination angle of the inclined portion 642 may be an acute angle.

As described above, the external connection electrode 640 is formed on the inclined surface 642 of the substrate 610, thereby reducing stress applied to the external connection electrode 640. Accordingly, the risk of breakage of the external connection electrode 640 or a defect occurring during a manufacturing process may be reduced.

In addition, the external connection electrode 640 may be formed using a conductive material such as molybdenum (Mo) or an alloy thereof. However, the disclosure is not limited to such an example, and the external connection electrode 640 may be formed of a conductive material such as ruthenium (Ru), tungsten (W), iridiym (Ir), platinium (Pt), copper (Cu), titanium (Ti), tantalum (Ta), nickel (Ni), chromium (Cr), or the like, or alloys thereof.

As an example, the external connection electrode 640 may be formed of a thin film.

Figure 7:
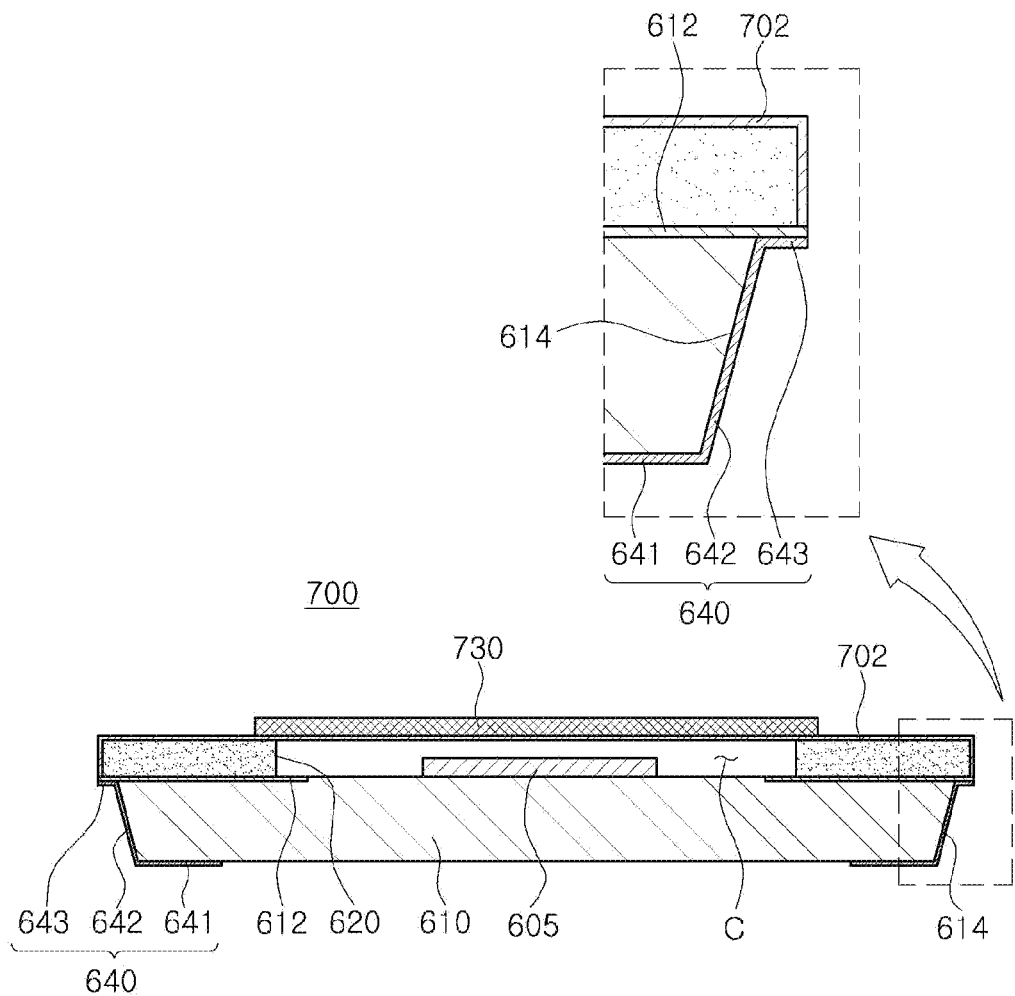
FIG. 7 is a schematic cross-sectional view illustrating a thin-film package, according to another embodiment.

FIG. 7 is a schematic cross-sectional view illustrating a thin-film package 700, according to another embodiment.

Referring to FIG. 7, the thin-film package 700 may include the substrate 610, the partition wall 620, a cap 730, and the external connection electrode 640, as an example.

The cap 730 may form a cavity C with the substrate 610 and the partition wall 620. An edge portion of the cap 730 may be disposed on the partition wall 620. As an example, the cap 730 may be formed of a metal material or a polymer material.

A passivation layer 702 may be formed on an upper surface and an outer surface of the partition wall 620. In addition, the passivation layer 702 may form hermetic seal. However, in another example, the passivation layer 702 may be omitted.

Figure 8:
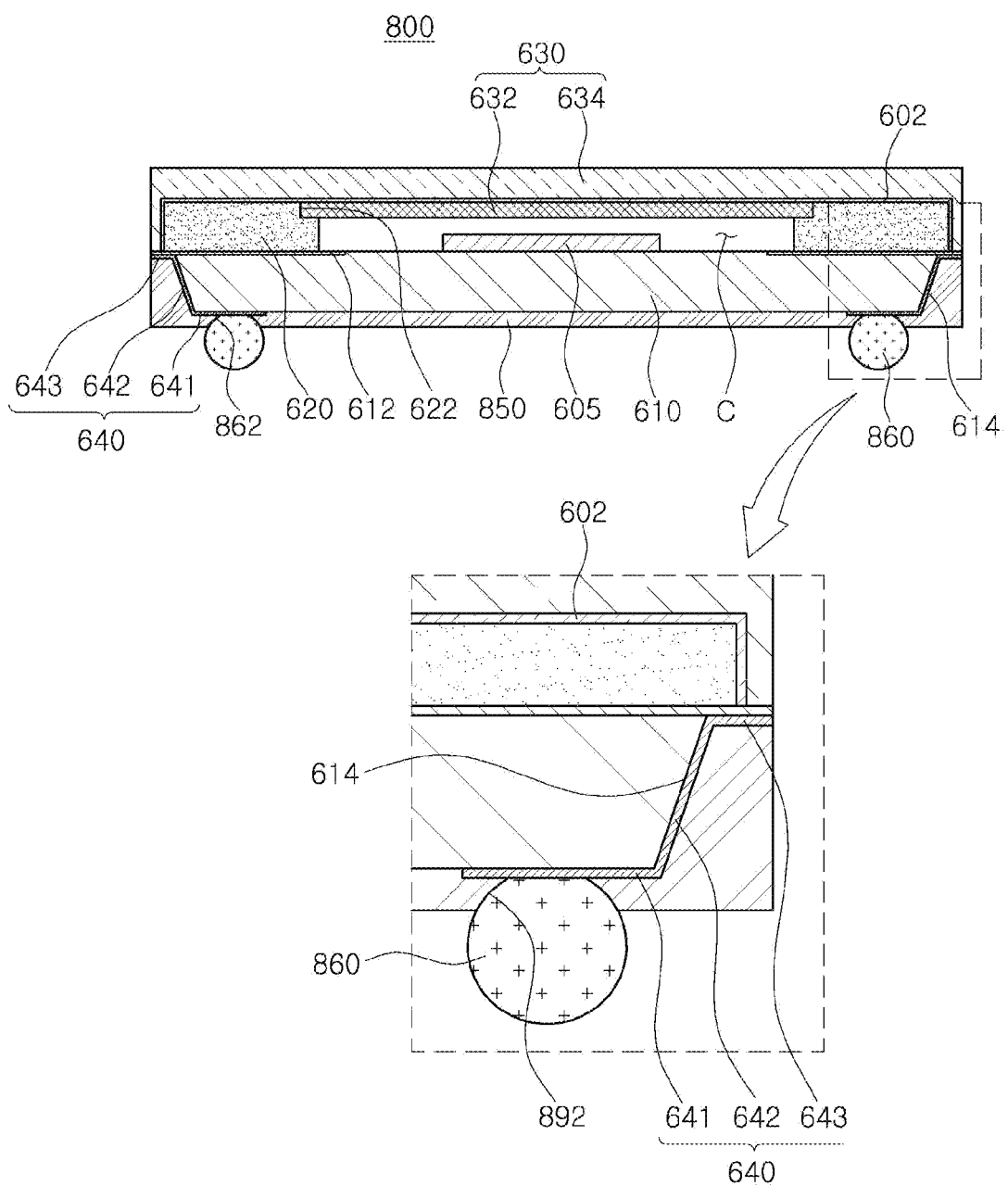
FIG. 8 is a schematic cross-sectional view illustrating a thin-film package, according to another embodiment.

FIG. 8 is a schematic cross-sectional view illustrating a thin-film package 800, according to another embodiment.

Referring to FIG. 8, the thin-film package 800 may include the substrate 610, the partition wall 620, the cap 630, the external connection electrode 640, and an encapsulant 850, as an example.

The encapsulant 850 is formed to cover the external connection electrode 640 and a lower surface of the substrate 610, and may include a hole 852 for a solder ball, into which a solder ball 860 connected to the external connection electrode 640 is inserted. The encapsulant 850 may protect the external connection electrode 640 and the substrate 610.

Figure 9:
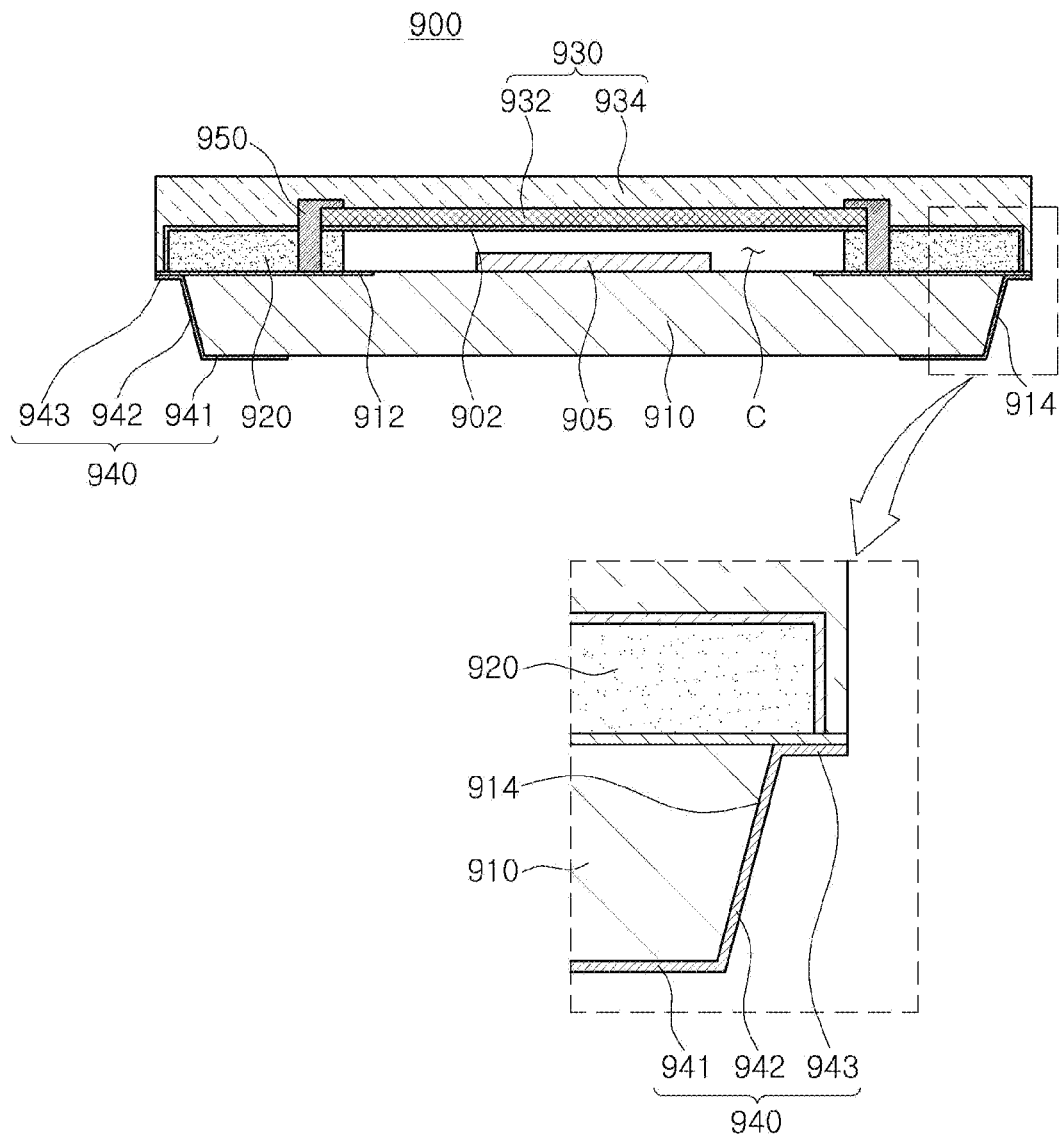
FIG. 9 is a schematic cross-sectional view illustrating a thin-film package, according to another embodiment.

FIG. 9 is a schematic cross-sectional view illustrating a thin-film package 900, according to another embodiment.

Referring to FIG. 9, the thin-film package 900 may include a substrate 910, a partition wall 920, a cap 930, an external connection electrode 940, and a through electrode 950, as an example.

The substrate 910 may be a silicon substrate. For example, a silicon wafer or a silicon-on-insulator (SOI) substrate may be used as the substrate 910. As an example, a wiring layer 912 is disposed on the substrate 910, and the wiring layer 912 is connected to the external connection electrode 940.

Although not illustrated in the drawings, a resonance portion (not shown) including a lower electrode, a piezoelectric layer, and an upper electrode is disposed on the substrate 910. In addition, the wiring layer 912 may be connected to either one or both of the lower electrode and the upper electrode.

As an example, a portion of the wiring layer 912 may be disposed to protrude outwardly from the substrate 910.

An inclined surface 914 may be formed on a side surface of the substrate 910. In addition, an inclination angle of the inclined surface 914 may be an acute angle.

The partition wall 920 is disposed on an edge region of the substrate 910, and forms a cavity C between the substrate 910 and the cap 930. In other words, the partition wall 920 enables a central portion of the substrate 910 to be spaced apart from a central portion of the cap 930 by a predetermined distance. The partition wall 920 may be formed of a polymer material.

The cap 930 may form a cavity C with the substrate 910 and the partition wall 920. Moreover, the cap 930 may include a first cap 932 disposed to cover the cavity C, and a second cap 934 disposed to cover the first cap 932. The first cap 932 may be formed of a metal material or a polymer material. In addition, an edge portion of the first cap 932 may be mounted on and installed in an upper surface of the partition wall 920.

The second cap 934 may be formed of a polymer material. In addition, a passivation layer 902 may be formed between the second cap 934 and the partition wall 920. The passivation layer 902 may form a hermetic seal. However, in another example, the passivation layer 902 may be omitted.

The second cap 934 is formed to cover a side surface of the partition wall 920. Accordingly, reliability of the hermetic seal may be improved.

The external connection electrode 940 may be connected to the wiring layer 912 of the substrate 910. As an example, the external connection electrode 940 may include a horizontal portion 941 formed on a lower surface of the substrate 910, an inclined portion 942 formed on an inclined surface 914 of the substrate 910, and a connection portion 943 connected to the wiring layer 912. An inclination angle of the inclined portion 942 may be an acute angle.

As described above, the external connection electrode 940 is formed on the inclined surface 942 of the substrate 910, thereby reducing stress applied to the external connection electrode 940. Accordingly, the risk of breakage of the external connection electrode 940 or a defect occurring during a manufacturing process may be reduced.

In addition, the external connection electrode 940 may be formed using a conductive material such as molybdenum (Mo) or an alloy thereof. However, the disclosure is not limited to such an example, and the external connection electrode 940 may be formed of a conductive material such as ruthenium (Ru), tungsten (W), iridiym (Ir), platinium (Pt), copper (Cu), titanium (Ti), tantalum (Ta), nickel (Ni), chromium (Cr), or the like, or alloys thereof.

As an example, the external connection electrode 940 may be formed of a thin film.

The through electrode 950 may connect the second cap 934, which is configured as a ground electrode, to the wiring layer 912 of the substrate 910. To this end, the through electrode 950 may be disposed in the partition wall 920 and the cap 930.

Figure 10:
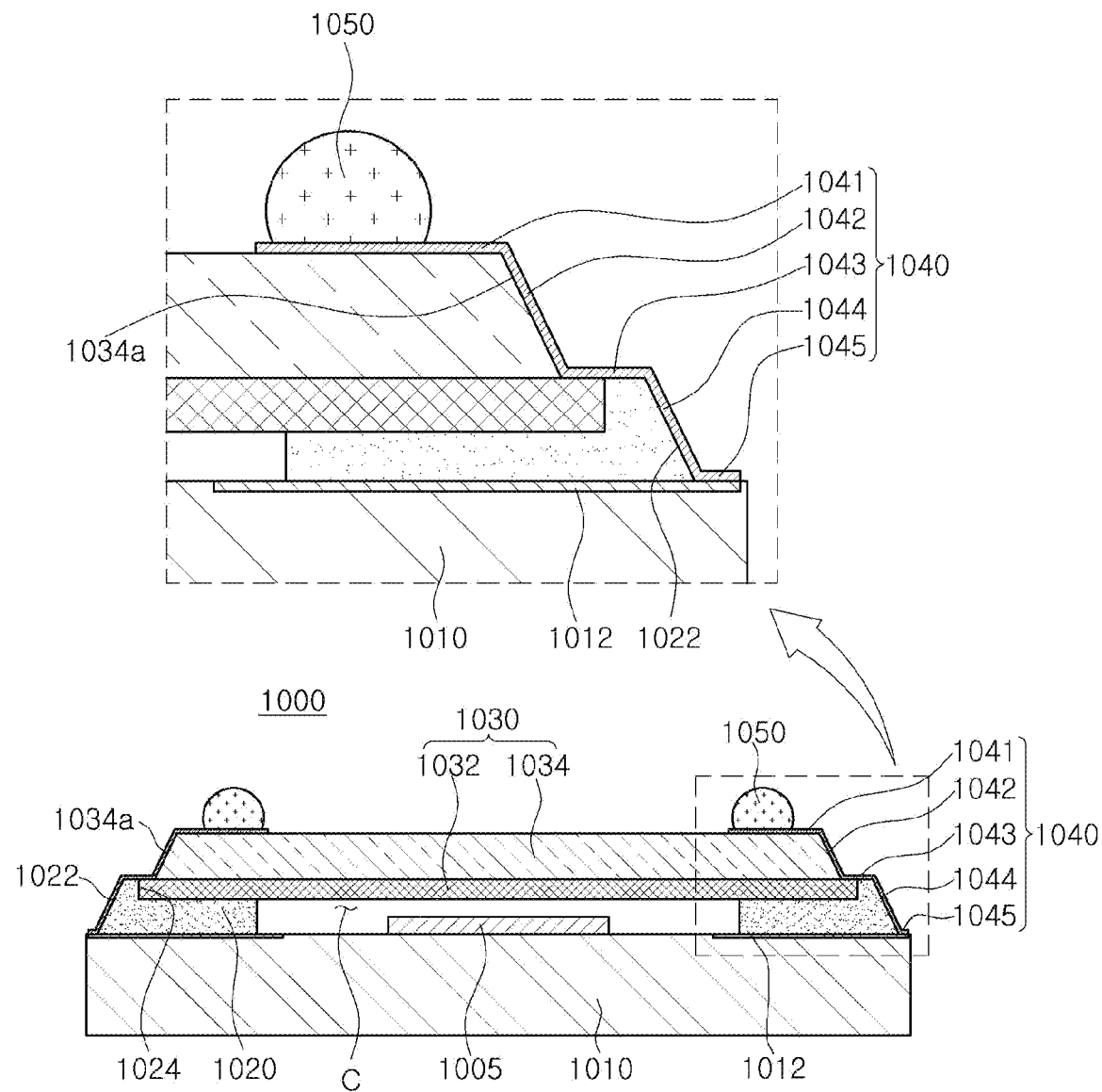
FIG. 10 is a schematic cross-sectional view illustrating a thin-film package, according to another embodiment.

FIG. 10 is a schematic cross-sectional view illustrating a thin-film package 1000, according to another embodiment.

Referring to FIG. 10, the thin-film package 1000 may include a substrate 1010, a partition wall 1020, a cap 1030, and an external connection electrode 1040, as an example.

The substrate 1010 may be a silicon substrate. For example, a silicon wafer or a silicon-on-insulator (SOI) substrate may be used as the substrate 1010. As an example, a wiring layer 1012 may be disposed on the substrate 1010, and the wiring layer 1012 is connected to the external connection electrode 1040.

A microelectromechanical systems (MEMS) element 1005 may be disposed on the substrate 1010. The MEMS element 1005 is disposed inside the partition wall 1020, and may be a bulk acoustic wave (BAW) resonator, a surface acoustic wave (SAW) resonator, an acceleration sensor, an angular velocity sensor, or the like, by way of example.

In addition, the wiring layer 1012 may be connected to an electrode provided on the MEMS element 1005.

The partition wall 1020 is disposed on an edge region of the substrate 1010, and forms a cavity C between the substrate 1010 and the cap 1030. In other words, the partition wall 1020 enables a central portion of the substrate 1010 to be spaced apart from a central portion of the cap 1030 by a predetermined distance. The partition wall 1020 may be formed of a polymer material. In addition, an inclined surface 1022 is formed on a side surface of the partition wall 1020. An inclination angle of the inclined surface 1022 may be an acute angle. In addition, a groove 1024 on which an edge portion of a first cap 1032 to be described later is mounted may be formed in the partition wall 1020.

The cap 1030 may form the cavity C with the substrate 1010 and the partition wall 1020. The cap 1030 may include a first cap 1032 disposed to cover the cavity C, and a second cap 1034 disposed on an upper portion of the first cap 1032. The first cap 1032 may be formed of a metal material, and may be configured as a ground electrode. Additionally, an inclined surface 1034a may be formed on the second cap 1034. In addition, an inclination angle of the inclined surface 1034a cap 1034 may be an acute angle.

The external connection electrode 1040 is connected to a wiring layer 1012 of the substrate 1010, and is formed to cover portions of the partition wall 1020 and the cap 1030. As an example, the external connection electrode 1040 may include a first horizontal portion 1041 formed on an upper surface of the second cap 1034, a first inclined portion 1042 formed on the inclined surface 1034a of the second cap 1034, a second horizontal portion 1043 disposed on an upper surface of the partition wall 1020, a second inclined portion 1044 formed on the inclined surface 1022 of the partition wall 1020, and a connection portion 1045 connected to the wiring layer 1012 of the substrate 1010. In addition, inclination angles of the first and second inclined portions 1042 and 1044 may be acute angles.

Accordingly, stress applied to the external connection electrode 1040 may be reduced. Thus, the risk of breakage of the external connection electrode 1040 or a defect occurring during a manufacturing process may be reduced.

Additionally, the second horizontal portion 1043 may be connected to the first cap 1032 of the cap 1030, which is configured as a ground electrode.

In addition, the external connection electrode 1040 may be formed using a conductive material such as molybdenum (Mo) or an alloy thereof. However, the disclosure is not limited to such an example, and the external connection electrode 1040 may be formed of a conductive material such as ruthenium (Ru), tungsten (W), iridiym (Ir), platinium (Pt), copper (Cu), titanium (Ti), tantalum (Ta), nickel (Ni), chromium (Cr), or the like, or alloys thereof.

As an example, the external connection electrode 1040 may be formed of a thin film.

A solder ball 1050 may be formed on the external connection electrode 1040. The solder ball 1050 may be formed on the first horizontal portion 1041.

Figure 11:
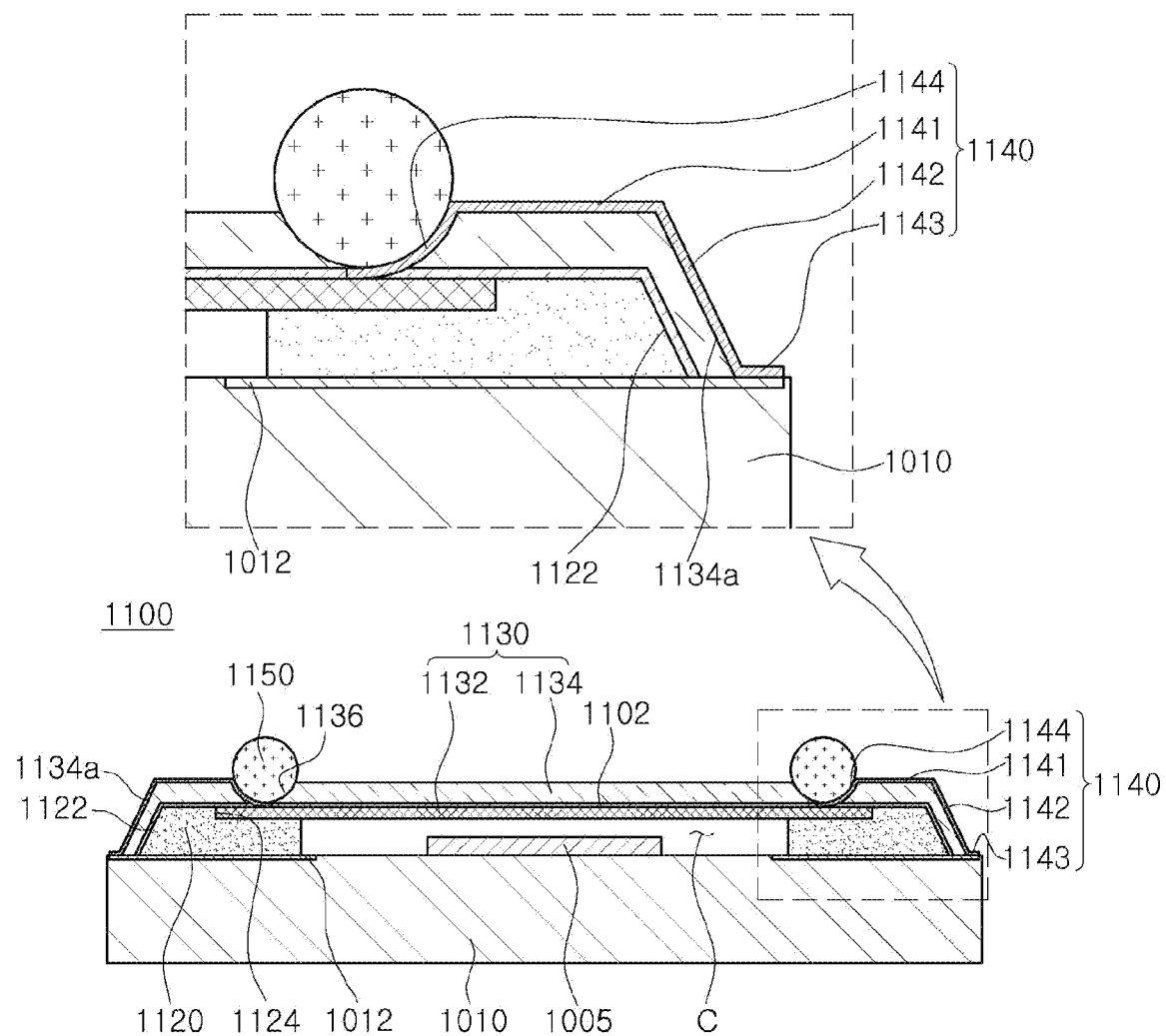
FIG. 11 is a schematic cross-sectional view illustrating a thin-film package, according to another embodiment.

FIG. 11 is a schematic cross-sectional view illustrating a thin-film package 1100, according to another embodiment.

Referring to FIG. 11, the thin-film package 1100 may include the substrate 1010, a partition wall 1120, a cap 1130, and an external connection electrode 1140, as an example.

The partition wall 1120 is disposed on an edge region of the substrate 1010, and serves to form a cavity C between the substrate 1010 and the cap 1030. In other words, the partition wall 1020 enables a central portion of the substrate 1010 to be spaced apart from a central portion of the cap 1030 by a predetermined distance. The partition wall 1020 may be formed of a polymer material. In addition, the inclined surface 1022 is formed on a side surface of the partition wall 1020. An inclination angle of the inclined surface 1022 may be an acute angle. In addition, a groove 1024 on which an edge of a first cap 1032 to be described later is mounted may be formed in the partition wall 1020.

The cap 1130 may form the cavity C with the substrate 1010 and the partition wall 1120. The cap 1130 may include a first cap 1132 disposed to cover the cavity C, and a second cap 1134 disposed to cover the first cap 1132. The first cap 1132 may be formed of a metal material. Additionally, the first cap 1132 may be configured as a ground electrode. In addition, an edge portion of the first cap 1032 is mounted on the groove 1024 of the partition wall 1020.

As an example, the second cap 1134 may be formed of a polymer material. The second cap 1134 may be disposed on an inclined surface 1122 of the partition wall 1120. Accordingly, an inclined surface 1134a is also formed in the second cap 1134. As described above, the second cap 1134 is formed to cover the partition wall 1120, thereby improving reliability of the hermetic seal.

A passivation layer 1102 may be formed on an upper surface of the first cap 1132, an upper surface of the partition wall 1120, and the inclined surface 1022. In addition, the passivation layer 1102 may form a hermetic seal. However, in another example, the passivation layer 1102 may be omitted.

The external connection electrode 1140 may be connected to the wiring layer 1012 of the substrate 1010. As an example, the external connection electrode 1140 may include a horizontal portion 1141 formed on an upper surface of the second cap 1134, an inclined portion 1142 formed on the inclined surface 1134a of the second cap 1134, a first connection portion 1143 connected to the wiring layer 1012, and a second connection portion 1144 formed in an installation hole 1136 of the cap 1130 and connected to the first cap 1132. An inclination angle of the inclined portion 1142 may be an acute angle.

As described above, the external connection electrode 1140 is formed on the inclined surface 1132 of the cap 1130, thereby reducing stress applied to the external connection electrode 1140. Accordingly, the risk of breakage of the external connection electrode 1140 or a defect occurring during a manufacturing process may be reduced.

A solder ball 1150 may be formed in the external connection electrode 1140.

In addition, the external connection electrode 1140 may be formed using a conductive material such as molybdenum (Mo) or an alloy thereof. However, the disclosure is not limited to such an example, and the external connection electrode 1140 may be formed of a conductive material such as ruthenium (Ru), tungsten (W), iridiym (Ir), platinium (Pt), copper (Cu), titanium (Ti), tantalum (Ta), nickel (Ni), chromium (Cr), or the like, or alloys thereof.

As an example, the external connection electrode 1140 may be formed of a thin film.

Figure 12:
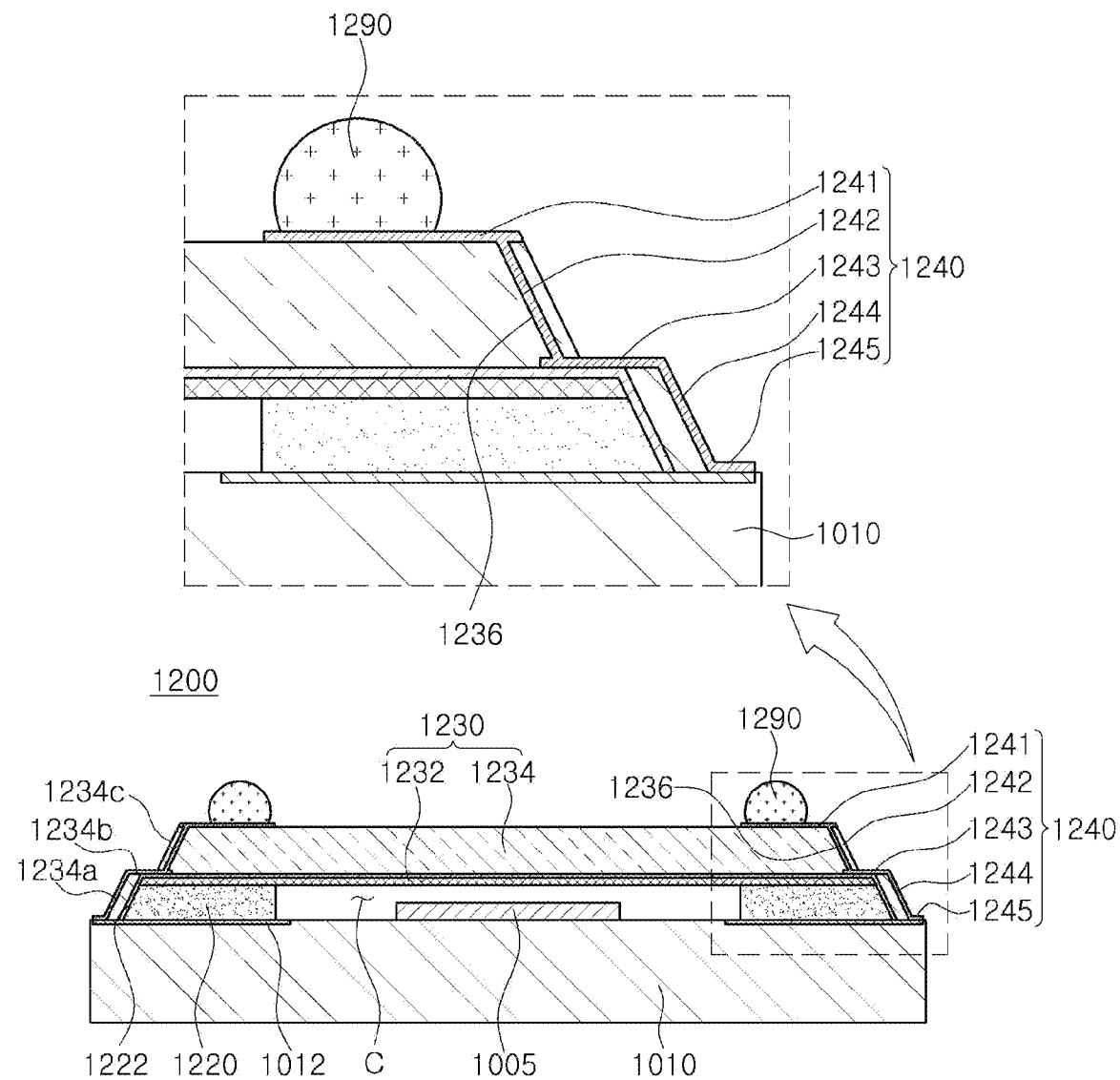
FIG. 12 is a schematic cross-sectional view illustrating a thin-film package, according to another embodiment.

FIG. 12 is a schematic cross-sectional view illustrating a thin-film package 1200, according to another embodiment.

Referring to FIG. 12, the thin-film package 1200 according to a twelfth embodiment may be configured to include the substrate 1010, a partition wall 1220, a cap 1230, and an external connection electrode 1240, as an example.

The partition wall 1220 is disposed on an edge region of the substrate 1010, and forms a cavity C between the substrate 1010 and the cap 1230. In other words, the partition wall 1220 enables a central portion of the substrate 1010 to be spaced apart from a central portion of the cap 1230 by a predetermined distance. The partition wall 1220 may be formed of a polymer material. In addition, an inclined surface 1222 is formed on a side surface of the partition wall 1220. An inclination angle of the inclined surface 1222 may be an acute angle.

The cap 1230 may form the cavity C with the substrate 1010 and the partition wall 1220. The cap 1230 may include a first cap 1232 disposed to cover the cavity C, and a second cap 1234 disposed to cover the first cap 1232. In addition, the first cap 1232 may be disposed on an upper portion of the partition wall 1220. The first cap 1232 may be formed of a metal material, and may be used as a ground electrode.

The second cap 1234 may be formed of a polymer material, by way of example. The second cap 1234 is formed to cover the inclined surface 1222 of the partition wall 1220. Accordingly, a first inclined surface 1234a is formed in the second cap 1234. As described above, the second cap 1234 is formed to cover the partition wall 1220, thereby improving reliability of the hermetic seal. Additionally, in the second cap 1234, a stepped surface 1234b, extended horizontally from an end of the first inclined surface 1234a, and a second inclined surface 1234c, extended from the stepped surface 1234b, may be provided.

The external connection electrode 1240 may be connected to the wiring layer 1012 of the substrate 1010. As an example, the external connection electrode 1240 may include a first horizontal portion 1241 formed on an upper surface of the cap 1230, a first inclined portion 1242 disposed in a communication hole 1236 of the second cap 1234, a second horizontal portion 1243 extended from the first inclined portion 1242 in a horizontal direction, a second inclined portion 1244 extended from the second horizontal portion 1243 and formed to cover the first inclined surface 1234a of the second cap 1234, and a connection portion 1245 extended from the second inclined portion 1244 and connected to the wiring layer 1012.

As described above, the second inclined portion 1244 is formed to cover the first inclined surface 1234*a* of the second cap 1234, thereby reducing stress applied to the external connection electrode 1240. An inclination angle of the second inclined portion 1244 may be an acute angle.

The second horizontal portion 1243 may be connected to the first cap 1232.

As set forth above, according to embodiments disclosed herein, thinning and miniaturization of a thin-film type package may be implemented and the manufacturing costs may be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A thin-film package, comprising:
a substrate;
a wiring layer disposed on the substrate;
a microelectromechanical systems (MEMS) element disposed on a surface of the substrate;
a partition wall disposed on the substrate to surround the MEMS element, and formed of a polymer material;
a cap forming a cavity with the substrate and the partition wall; and
an external connection electrode connected to the wiring layer,
wherein the external connection electrode comprises at least one inclined portion disposed on at least one inclined outer side surface formed on any one or any combination of any two or more of the substrate, the partition wall, and the cap.

2. The thin-film package of claim 1, wherein the cap comprises a first cap disposed to cover the cavity, and a second cap disposed to cover the first cap and formed of a polymer material.

3. The thin-film package of claim 2, wherein the partition wall comprises an inclined outer surface, and the second cap comprises an inclined surface corresponding to the inclined outer surface of the partition wall.

4. The thin-film package of claim 3, wherein an inclined portion, among the at least one inclined portion, is disposed on the inclined surface of the second cap.

5. The thin-film package of claim 2, wherein a passivation layer is formed between the partition wall and the second cap.

6. The thin-film package of claim 2, wherein the partition wall comprises an inclined outer surface, and the second cap comprises an inclined surface disposed inside the inclined outer surface of the partition wall.

7. The thin-film package of claim 6, wherein the at least one inclined portion comprises a first inclined portion disposed on the inclined surface of the second cap, and a second inclined portion disposed on the inclined outer surface of the partition wall.

8. The thin-film package of claim 7, wherein the external connection electrode further comprises a first horizontal portion disposed on an upper surface of the second cap and connected to the first inclined portion, a second horizontal portion disposed on an upper surface of the partition wall and connected to the first and the second inclined portions, and a connection portion comprising a side connected to the second inclined portion, and another side connected to the wiring layer.

9. The thin-film package of claim 2, wherein the external connection electrode comprises a first horizontal portion disposed on an upper surface of the second cap, a via portion passing through the second cap, a second horizontal portion disposed on an upper portion of the partition wall, and a connection portion connected to the wiring layer and an inclined portion, among the at least one inclined portion, and
wherein the inclined portion is disposed on an inclined outer side surface, among the at least one inclined outer side surface, that is disposed on the partition wall.

10. The thin-film package of claim 2, wherein the external connection electrode comprises a horizontal portion disposed on an upper portion of the partition wall and connected to a solder ball that passes through the second cap, and a connection portion connected the wiring layer and an inclined portion, among the at least one inclined portion, and
wherein the inclined portion is disposed on an inclined outer side surface, among the at least one inclined outer side surface, that is disposed on the partition wall.

11. The thin-film package of claim 1, wherein an inclined outer side surface, among the at least one inclined outer side surface, is disposed on a side surface of the substrate, and an inclined portion, among the at least one inclined portion, is disposed on the inclined outer side surface.

12. The thin-film package of claim 11, further comprising an encapsulant formed to cover the substrate.

13. The thin-film package of claim 2, wherein the second cap is formed of a metal material, the second cap is connected to the external connection electrode, and the second cap is configured as a ground electrode.

14. The thin-film package of claim 13, further comprising a through electrode connecting the second cap to the wiring layer.

15. The thin-film package of claim 14, wherein an inclined outer side surface, among the at least one inclined outer side surface, is disposed on a side surface of the substrate, and an inclined portion, among the at least one inclined portion, is disposed on the inclined outer side surface.

16. A thin-film package, comprising:
a substrate;
a wiring layer disposed on the substrate;
a partition wall disposed on the substrate;
a first cap formed of a metal material, and forming a cavity with the substrate and the partition wall;
a second cap formed to cover the first cap; and
an external connection electrode connected to the wiring layer and the first cap,
wherein the external connection electrode comprises a first inclined portion disposed on an inclined outer side surface of the partition wall.

17. The thin-film package of claim 16, wherein the external connection electrode further comprises a first horizontally extending portion disposed on an upper surface of the first cap.

18. The thin-film package of claim 17, wherein the external connection electrode further comprises a second inclined portion extending from the first horizontally extending portion, and disposed on an inclined side surface of the second cap.

19. The thin-film package of claim 18, wherein the external connection electrode further comprises second horizontally extending portion extending from the second inclined portion, and disposed on an upper surface of the second cap.

* * * * *